(12) United States Patent
Urakami et al.

(10) Patent No.: US 6,345,005 B2
(45) Date of Patent: Feb. 5, 2002

(54) INTEGRATED CIRCUIT WITH EFFICIENT TESTING ARRANGEMENT

(75) Inventors: Aki Urakami; Michio Nakajima, both of Tokyo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/734,925

(22) Filed: Dec. 13, 2000

(30) Foreign Application Priority Data

Jan. 27, 2000 (JP) .......................................... 12-019170

(51) Int. Cl.[7] .............................................. G11C 7/00
(52) U.S. Cl. .................................... 365/201; 365/189.01
(58) Field of Search ........................... 365/201, 189.02, 365/230.02, 230.03

(56) References Cited

U.S. PATENT DOCUMENTS 5,870,340 A * 2/1999 Oshawa ...................... 365/201

FOREIGN PATENT DOCUMENTS

JP 11-176188 7/1999

* cited by examiner

*Primary Examiner*—Vu A. Le
(74) *Attorney, Agent, or Firm*—Burns, Doane, Swecker & Mathis, LLP (57) ABSTRACT

A read and write control circuit receives (m×n))-bit data output m-bit parallel from a D flip flop, and a q-bit data selection signal such that the output data from the D flip flop is written to memory circuits in units of integral multiples of (x+1) bits in a total of $2^q$ operations, in accordance with a binary value indicated by the data selection signal, where m, n, x and q indicates positive integers (x+1)>m and n>$2^q$, where m, n, x and 1 indicate positive integers and (x+1)>m and n>$2^q$. The data written to the memory circuits is read out in units of integral multiples of (x+1) bits in a total of $2^q$ operations.

5 Claims, 10 Drawing Sheets

INTEGRATED CIRCUIT WITH EFFICIENT TESTING ARRANGEMENT

BACKGROUND OF THE INVENTION

1. Field of the Invention

The present invention generally relates to an integrated circuit provided with a memory unit main body such as a dynamic random access memory (DRAM) and, more particularly, to improvement in efficiency of a test of a memory unit main body in a semiconductor circuit.

2. Description of the Related Art

Figure 9:
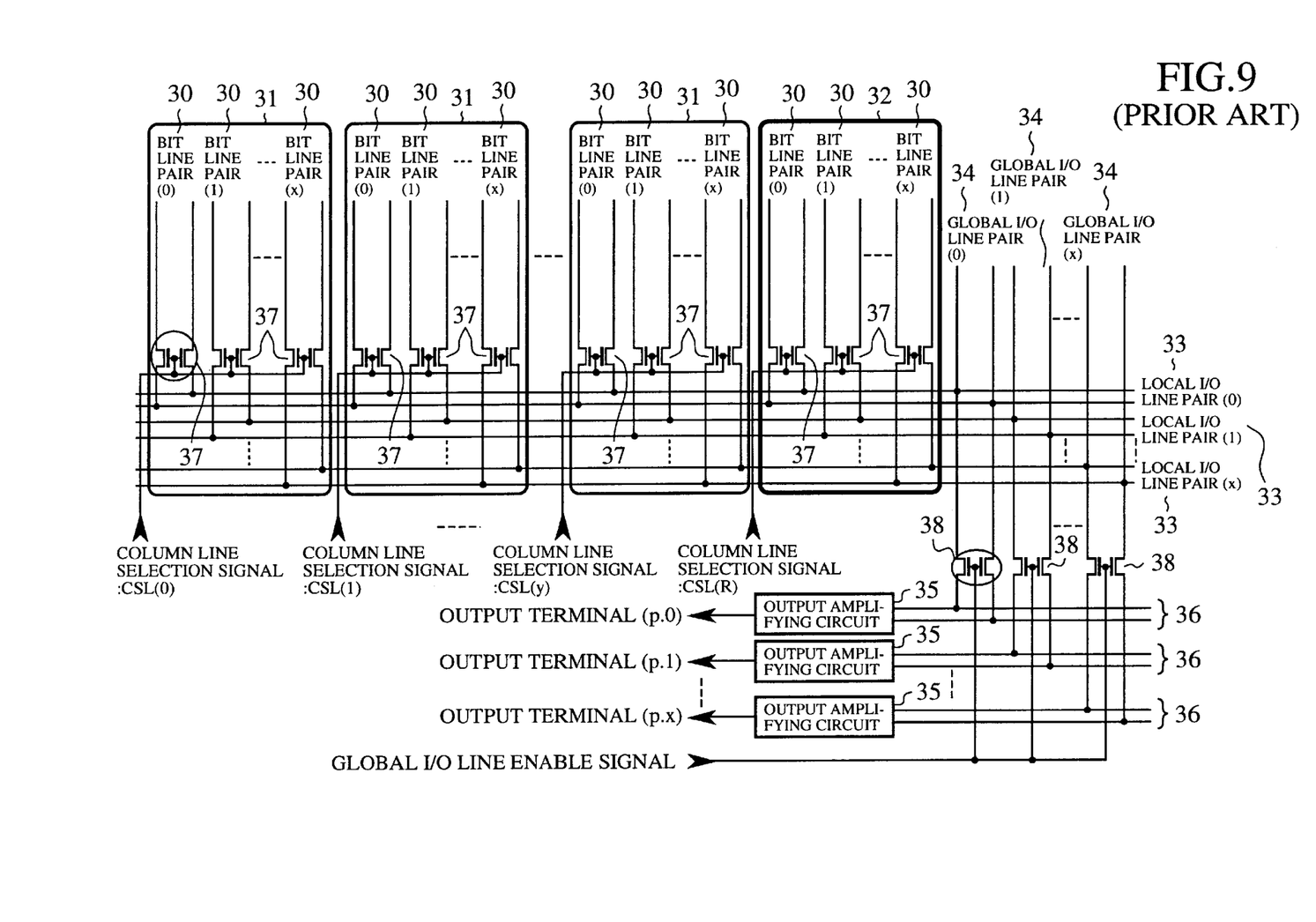
FIG. 9 shows a circuit construction of a memory circuit in a memory unit main body.

FIG. 9 shows a circuit construction of a memory circuit in a memory unit main body such as a dynamic random access memory (DRAM). The memory circuit is capable of outputting (x+1)-bit data simultaneously. The memory unit main body is provided with a total of (p+1) memory circuits for each address. x and p indicate positive integers.

Referring to FIG. 9, the memory unit main body comprises bit line pairs 30 to each of which a plurality of memory elements are connected so that one of the plurality of memory elements is selected for connection by a row address; memory blocks 31 provided with a total of (x+1) bit line pairs 30; a redundant memory block 32 for a recovering purpose provided with a total of (x+1) bit line pairs 30; a total of (x+1) local I/O line pairs 33 each connecting the plurality of memory blocks 31 and 32; a total of (x+1) global line pairs 34 each connected to a respective one of the local I/O line pairs 33; a total of (x+1) output amplifier circuits 35 each connecting the selected memory element with an internal address bus of an integrated circuit; output signal line pairs 36 each connected to a respective one of the output amplifying circuits 35; bit line pair connection switches 37 each provided in a respective one of the memory blocks 31 or the redundant memory block 32 so as to connect a respective one of the bit line pairs 30 to a respective one of the local I/O line pairs 33 in accordance with a column line selection signal generated based on a column address; global I/O line pair connection switches 38 for connecting a respective one of the global I/O line pairs 34 to a respective one of the output signal line pairs 36 in accordance with a global I/O enable signal generated based on a column address.

The memory unit main body is constructed such that a row address is strobed by a row address strobe signal so as to connect a plurality of memory elements in the memory blocks 31 associated with the same row address with the respective bit line pairs 30. The column address is strobed by the column address strobe signal, whereupon a column line selection signal and a global I/O enable signal are generated based on the column address so that one of the memory blocks 31 is connected to the corresponding local I/O line pair 33 and one of the global I/O line pairs 34 is connected to the corresponding output signal line pair 36. This way, data corresponding to the contents of the (x+1) memory elements in the memory block 31 are output from the output amplifying circuit 35.

Figure 10:
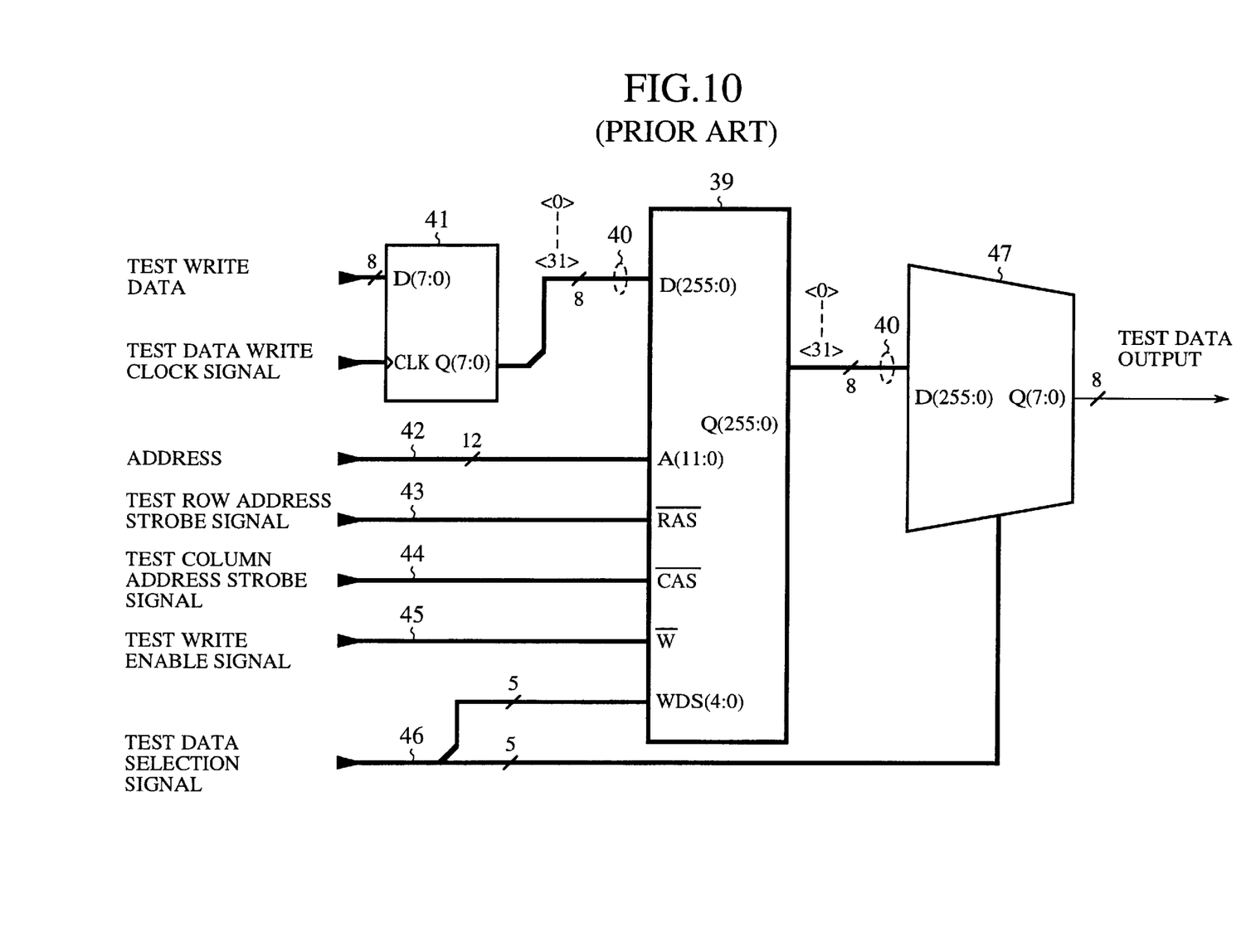
FIG. 10 is a block diagram showing a construction of a memory unit provided with a memory unit main body.

FIG. 10 is a block diagram showing a construction of a memory unit provided with the memory unit main body as described above. The memory unit is used together with a function unit (not shown) so as to form an integral part in an integrated circuit. Data is exchanged between the memory unit and the function unit via a bus with an (m×n))-bit width. In a test mode of the memory unit, m-bit data is input and output between a tester and the memory unit.

Referring to FIG. 10, the memory unit comprises: a memory unit main body 39; an internal data bus 40 having an (m×n))-bit width and used for data exchange between the memory unit 39 and a function unit (not shown); a flip-flop 41 receiving a test data write clock signal and m-bit test write data and causing, in a test mode, each data latched by the test data write clock signal to branch to n individual signal lines so as to output the (m×n)-bit signal to the internal data bus 40; an address bus 42; a test row address strobe signal line 43; a test column address strobe signal line 44; a test write enable signal line 45; a q(=log$_2$n)-bit test data selection signal line 46; and a data multiplexer 47 connected to the internal data bus 40 and selecting m-bit data in accordance with a binary value occurring on the test data selection signal line 46 for output to an external unit. The memory unit main body 39 also selects m-bit data on the internal data bus 40 in accordance with the binary value occurring on the data selection signal line 46 so as to write or read the m-bit data.

A description will now be given of the operation according to the related art.

In a test mode, m-bit data output from a tester is latched by the D flip-flop 41. The (m×n)-bit resulting from the branching of the latched data to the n individual signal lines is output to the internal data bus 40. The row address is set in the address bus 42 and the test write enable signal line 45 is brought to a write enable level. In this state, the test row address strobe signal is asserted so that the road address is set. Further, the column address is set in the address bus 42 and a predetermined binary value is set in the data selection signal line 46. In this state, the test column address strobe signal is asserted. With this, data is written in the m memory elements corresponding to the binary value. By changing the binary value a total of n times by incrementing it from "00 . . . 00" to "11 . . . 11", data is written in a total of (m×n)) memory elements corresponding to an addresses comprising the row address and the column address. By repeating this procedure for the entirety of the addresses, data is written in all of the memory elements.

Subsequently, by setting a row address and a column address in the memory unit main body 39 using a similar procedure, the data in the (m×n) memory elements are output to the internal bus 40. By changing the level occurring on the test data selection signal line 46 a total of n times by incrementing it from "00 . . . 00" to "11 . . . 11", data is read out from the (m×n) memory elements corresponding to an address. By repeating the procedure for the entirety of the addresses, data is read out from all of the memory elements.

When it is found that the read data matches the written data, a determination is made that the memory block 31 is not defective. When it is determined that the data do not match, a determination is made that the memory block 31 that caused a mismatch is defective. A recovery code is then output so as to use the redundant memory block 32 in place of the defective memory block 31.

Since the integrated circuit according to the invention is constructed as described above, a write process and a read process are performed in a memory element a relatively large number of times. Thus, an enormous amount of time is required to test the memory unit.

With the high-integration large-capacity memory units that are built recently, the time required for a memory test is increased so significantly that the productivity suffers.

For example, if the integrated circuit as described above is provided with a 256-bit wide internal data bus and configured to receive 8-bit write data and output 8-bit readout data, a write process and a read process should be repeated for total of 32 (n=256/8=32) times for memory elements corresponding to a given address.

SUMMARY OF THE INVENTION

Accordingly, a general object of the present invention is to provide an integrated circuit in which the aforementioned problem is eliminated.

Another and more specific object of the present invention is to provide an integrated circuit in which a write process and a read process are performed efficiently by taking advantage of the memory construction inherent in the memory unit, and in which it is possible to conduct a memory test and to generate a recovery code more efficiently and in a shorter period of time than in the integrated circuit provided with the memory unit according to the related art described above.

Still another object of the present invention is to provide an integrated circuit in which the aforementioned objects can be achieved without increasing the number of terminals used in the test mode, that is, by using a limited number of input and output terminals provided in the integrated circuit.

The aforementioned objects can be achieved by an integrated circuit comprising: a D flip-flop receiving m-bit write data and a clock signal, causing the m-bit data latched by the clock signal to branch to n individual signal lines and outputting the resultant (m×n)-bit data; and a plurality of memory circuits provided with a plurality of memory blocks including a recovery memory block and configured to input and output (x+1)-bit data simultaneously; and a write control circuit receiving, m-bit parallel, the (m×n)-bit data output from the D flip-flop, receiving a q-bit data selection signal and writing, in accordance with a binary value indicated by the q-bit data selection signal, the output data from the D flip flop to the plurality of memory circuits in units of integral multiplex of (x+1) bits in a total of $2^q$ operations, where m, n, x, and q indicate positive integers, (x+1)>m and n>$2^q$.

The integrated circuit may further comprise: a match determination circuit subjecting the multiples-of-(x+1)-bit data output from each of the plurality of memory circuits to determination on a match and outputting results of the determination; a determination result output circuit receiving results of the determination from the match determination circuit, receiving the q-bit data selection signal and outputting match determination data indicating a data mismatch occurring in the match determination circuit in accordance the binary value indicated by the data selection signal.

The integrated circuit may further comprise: a tristate buffer receiving the readout data from the plurality of memory circuits and receiving, as a control signal, the output from the determination result output circuit.

The integrated circuit may further comprise: encoders each provided for a corresponding memory circuit in which the same data is written, so as to encode data input to the corresponding memory circuit; and decoders each provided for a corresponding memory circuit in which the same data is written, so as to encode data output the corresponding memory circuit.

The encoders and decoders may be operated in accordance with an address.

BRIEF DESCRIPTION OF THE DRAWINGS

Other objects and further features of the present invention will be apparent from the following detailed description when read in conjunction with the accompanying drawings, in which.

DETAILED DESCRIPTION OF THE PREFERRED EMBODIMENTS

Embodiment 1

Figure 1:
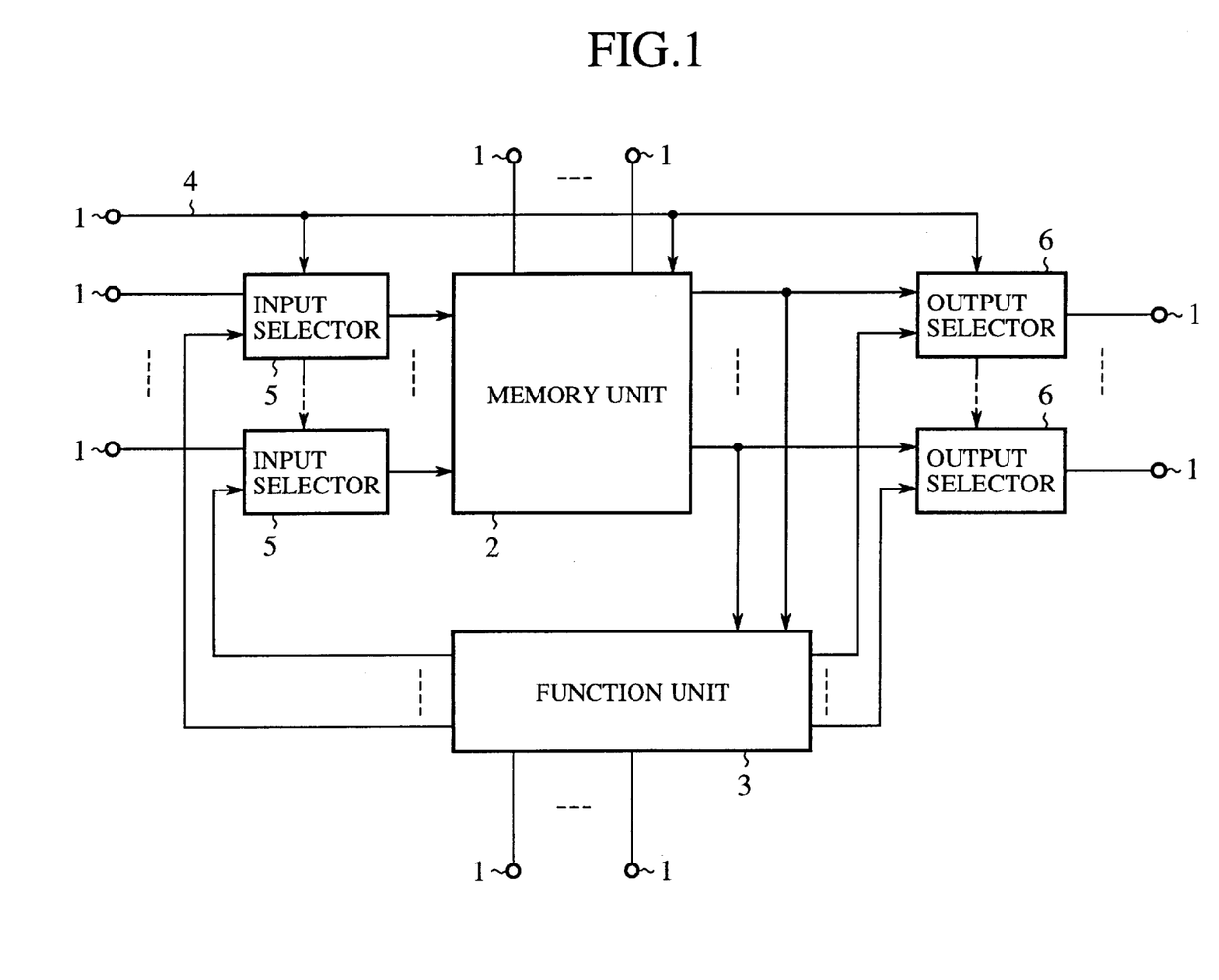
FIG. 1 is a block diagram showing a construction or an integrated circuit according to a first embodiment of the present invention.

FIG. 1 is a block diagram showing a construction of an integrated circuit according to a first embodiment of the present invention. Referring to FIG. 1, the integrated circuit comprises: input and output terminals 1 used for input and output of a data signal, a test address signal and the like transferred between the integrated circuit and an external device such as a tester (not shown); a memory unit 2 provided with a total of (p+1) memory circuits as shown in FIG. 9, each of the (p+1) memory circuits being capable of outputting (x+1)-bit data simultaneously and comprising a plurality of memory blocks each provided with a total of (x+1) memory elements; a function unit 3 for executing a predetermined process using data stored in the memory unit 2; a mode signal line 4 for providing a mode switching signal, for switching between a test mode and a normal operation mode, to the memory unit 2; an input selector 5 for selecting either an output signal from the function unit 3 or an input signal provided via a respective one of the input and output terminals 1, in accordance with the mode switching signal, so as to output the selected signal to the memory unit 2; and an output selector 6 for selecting either an output signal from the memory unit 2 or an output signal from the function unit 3, in accordance with the mode switching signal, so as to output the selected signal to a respective one of the input and output terminals 1.

The internal bus used in the integrated circuit is formed as an (m×n)-bit wide bus, where m and n are positive integers.

Figure 2:
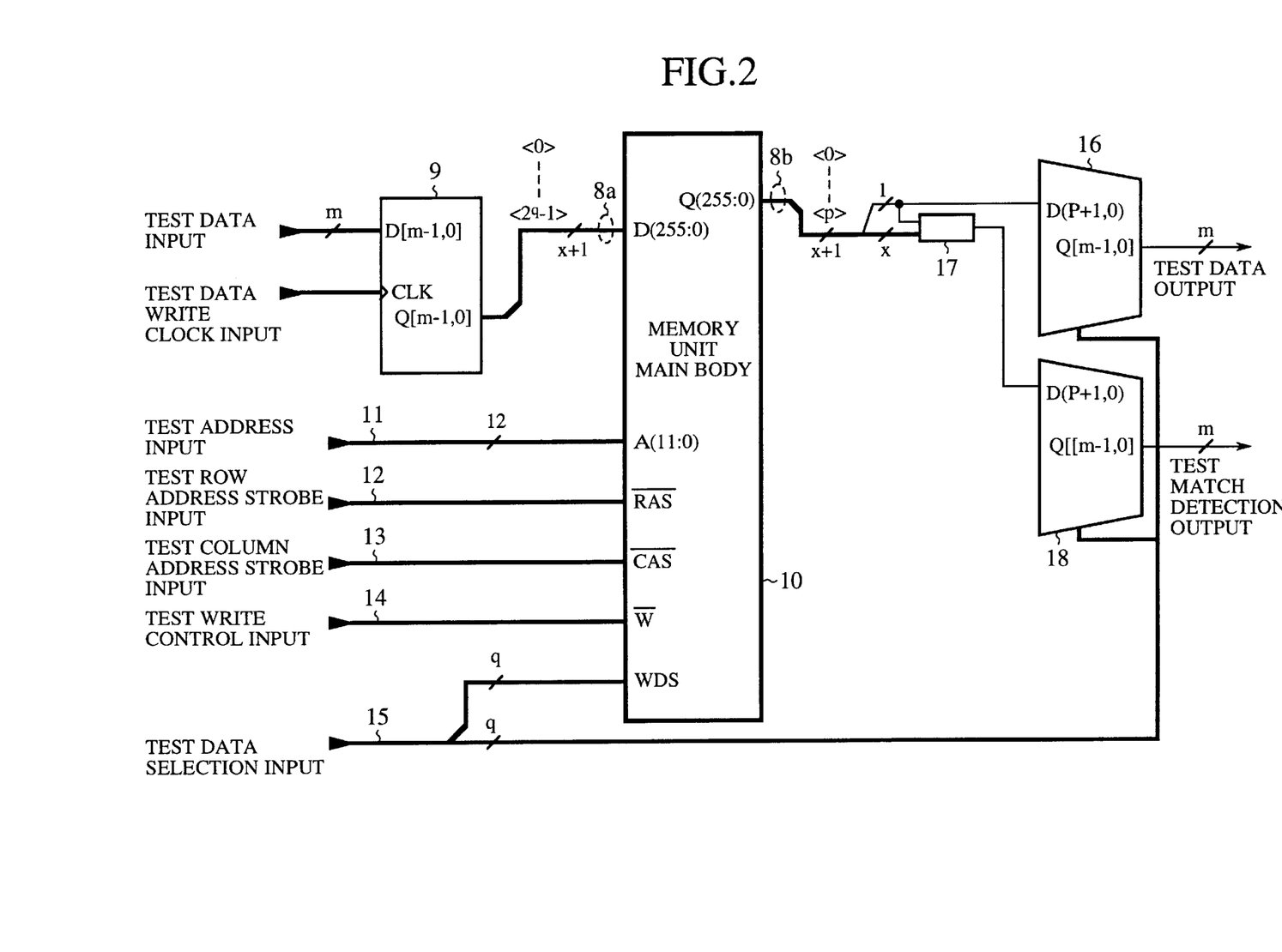
FIG. 2 is a block diagram showing a construction of a memory unit according to the first embodiment.

FIG. 2 is a block diagram showing a construction of the memory unit 2 according to the first embodiment. Referring to FIG. 2, the memory unit 2 comprises: an $2^q*(x+1)$-bit wide internal data bus 8a. More specifically, the internal data bus 8a comprises a total of $2^q$ individual internal data bus signal lines each having a width of (x+1) bits. The memory unit 2 also comprises a D flip-flop 9 for receiving a test data write clock signal and a m-bit test write data from an external device and causing, in a test mode, the data latched by the test data write clock to branch to n individual signal lines so that the resultant (m×n)-bit signal is output to the internal data bus 8; a memory unit main body (memory circuit; write and read control circuit) 10 such as a DRAM comprising a memory unit as shown in FIG. 9, the memory circuit being provided with a plurality of memory blocks including a large number of memory elements; an address bus 11 for feeding an externally provided test address signal to the memory unit main body 10; a test row address strobe signal line for feeding an externally supplied test row address strobe signal to the memory unit main body 10; a test column address strobe signal line for feeding an externally supplied test column address strobe signal to the memory unit main body 10; a test write enable signal line for feeding an externally supplied test write enable signal to the memory unit main body 10; a test data selection signal line 15 for feeding an externally supplied q-bit input and output data selection signal to the memory unit main body 10.

The memory unit main body 10 has a construction similar to that of the memory unit main body 39 described above with reference to FIG. 9. The memory unit main body 10 is provided with a plurality of memory blocks 31 and a recovery memory block 32. A memory space for each row address is constructed of a total of (p+1) memory circuits each capable of simultaneously inputting and outputting (x+1)-bit data. Therefore, the relationship (x+1)*(p+1)=(m×n) holds, where x and p indicate positive integers.

The (m×n)-bit data from the D flip-flop 9 is input m-bit parallel to the memory unit main body 10. When the memory unit main body 10 receives the q-bit input and output data selection signal, the data from the D flip-flop 9 is written in units of (x+1) bits to the memory circuits in a total of $2^q$ operations.

According to the first embodiment, the internal bus 8a having the $2^q$×(x+1)-bit bus width is fully taken advantage of. By ensuring that the data is written in larger units of (x+1) bits than in the related art, i.e., by ensuring that (x+1)>m, the required number of write operations is reduced such that n>$2^q$ so that time required for a test is reduced. It is to be noted that the relationship $2^q$×(x+1)=m×n holds.

The memory unit 2 further comprises a data multiplexer 16 connected to a total of (p+1) signal lines constituting an internal data bus 8b from the respective memory circuits of the memory unit main body 10. A q-bit input and output selection signal is input to the data multiplexer. In a test mode, a selected 1 bit from the (x+1) output bits is input to the multiplexer 16, for each of the memory circuits. In accordance with the binary value indicated by the q-bit input and output selection input to the multiplexer 16, signal lines associated with the memory circuits, in which are written data derived from the same input bits, are selected. The data multiplexer 16 outputs m-bit readout data so as to indicate in which memory block a failure has occurred, by degenerative conversion. A degenerative conversion refers to conversion of memory data output into valid defective address information.

The memory unit 2 further comprises a match detection circuit 17 provided for each memory circuit. That is, a total of (p+1) match detection circuits 17 are provided. In a test mode, the match detection circuit 17 subjects to comparison the (x+1) bits output from the respective one of the memory circuits to the internal data bus 8b, in order to determine whether there is a match and outputs 1-bit signals indicating the results of determination. The memory unit 2 further comprises a match determination multiplexer 18 for receiving the (p+1) determination results and the q-bit input and output data selection signal. In a test mode, the match determination multiplexer 18 selects designated ones of the results of determination, output from the match detection circuit 17, related to memory circuits each of which has the data derived from the same input bits written thereto, the designation being provided in the form of the binary value indicated by the q-bit input and output data selection signal. Thereupon, the match determination multiplexer 18 outputs m-bit match determination data indicating a report on a mismatch occurring in the match detection circuit 17, the m-bit match determination data being obtained by degenerative conversion.

In a test mode, the m-bit readout data and the m-bit match determination data are output from the input and output terminal 1 to the tester via the output selector 6.

Figure 3:
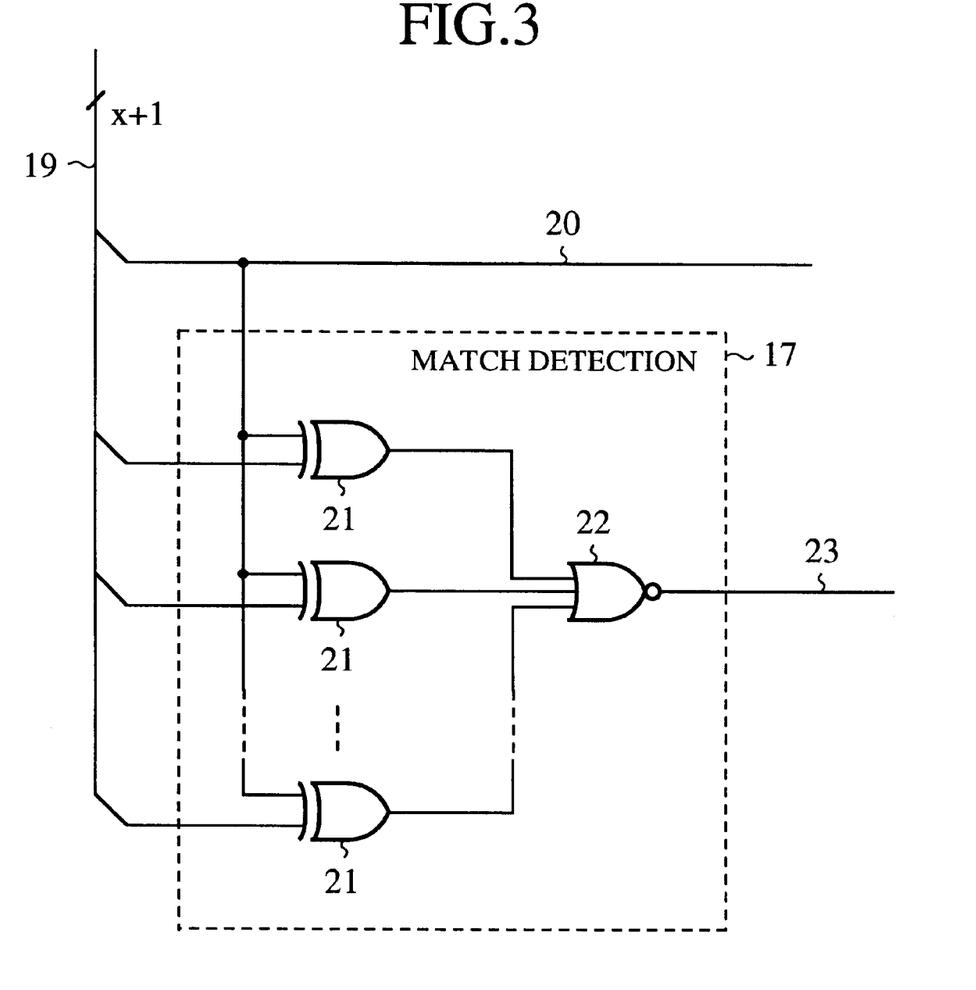
FIG. 3 is a block diagram showing a construction of a match detection circuit according to the first embodiment.

FIG. 3 is a block diagram showing a construction of the match detection circuit 7 according to the first embodiment. Referring to FIG. 3, the match detection circuit 17 comprises a total of (x+1) internal data bus signal lines from the same memory circuit; an output internal data bus signal line 20 selected from the (x+1) internal data bus signal,lines 19 and connected to the data multiplexer 16; a total of x XOR circuits 21 each determining whether a match occurs by comparing the data on the output internal data bus signal line 20 with the data on a respective one of the remaining internal data bus signal lines 19; a NOR circuit 22 for NORing outputs the x XOR circuits 21; and a signal line 23 for feeding an output from the NOR circuit 22 to the match determination multiplexer 18. With this construction, when the data on all of the (x+1) internal data bus signal lines 19 from the same memory circuit match, that is, when either "0" or "1" occurs on all of the internal data bus signal lines 19, a high-level signal is output to the signal line 23. When any of the (x+1) internal data bus signal lines 19 differs in value from the other lines 19, a low-level signal is output to the signal line 23.

A description will now be given of operation of the integrated circuit.

In a state in which a signal for asserting a normal operation mode is input to the input and output terminal 1 for the mode switching signal, the input selector 5 outputs the output signal form the function unit 3 to the memory unit 2, and the output selector 6 outputs the output signal from the function unit 3 to the respective one of the input and output terminals 1. The function unit 3 and the memory unit 2 exchange signals in accordance with signals from the input and output terminals 1 connected thereto so that the associated input and output terminals output signals resulting from the normal operation.

When a signal for asserting the test mode is fed to the input and output terminal 1 for the mode switching signal, the selector 5 outputs the signal from the input and output terminal 1 to the memory unit 2 and the output selector 6 outputs the output signal from the memory unit 2 to the input and output terminal 1. In the test mode, the mode switching signal is fed from the tester (not shown) to the associated input and output terminal 1.

Figure 4:
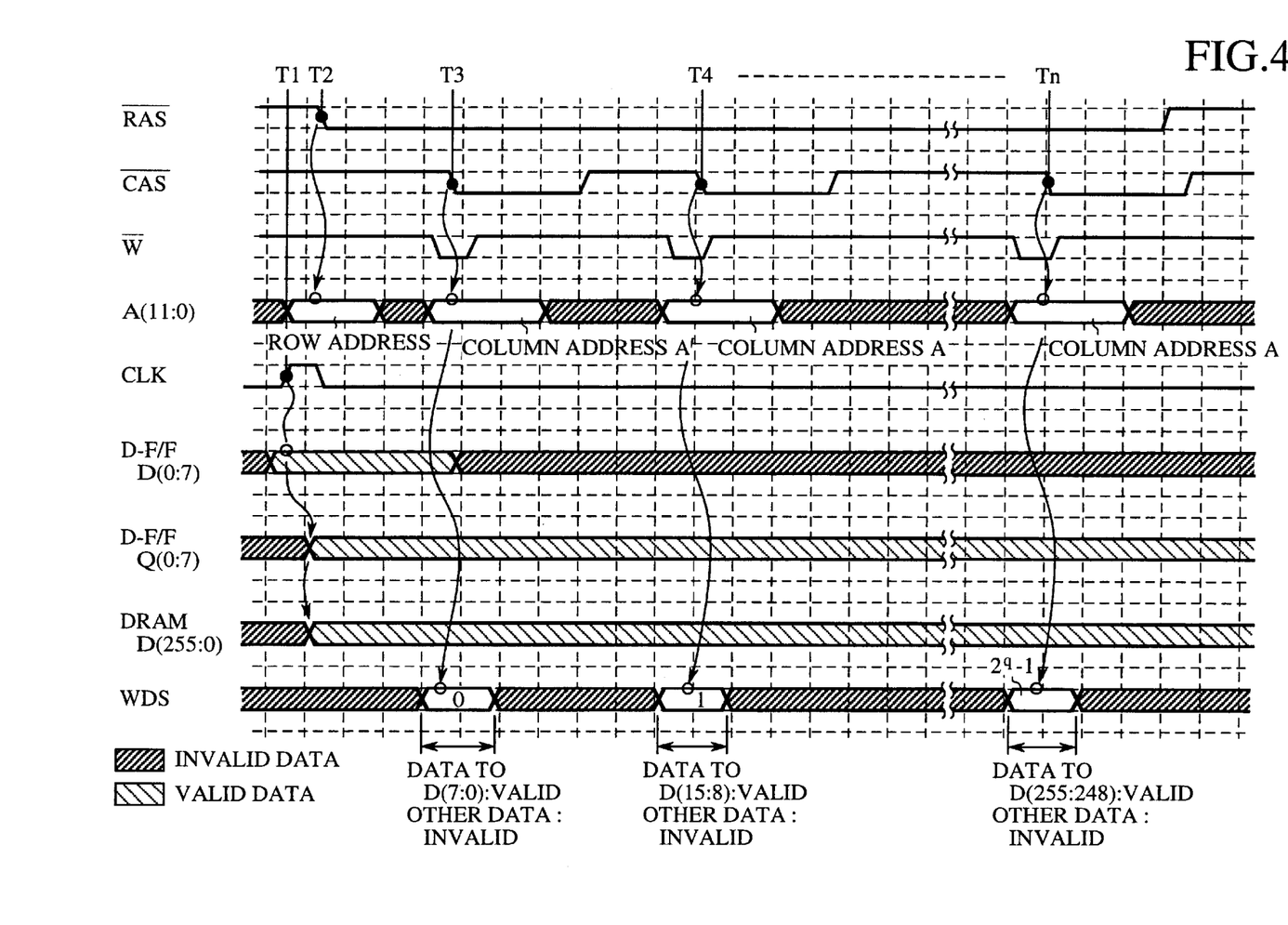
FIG. 4 is a timing chart showing a write process for writing to a memory unit main body in a test mode, according to the first embodiment.

In the test mode, the tester executes a sequence for writing predetermined data to all of memory elements. FIG. 4 is a timing chart showing a write process for writing to the memory unit main body 10 in the test mode, according to the first embodiment. The timing chart of FIG. 4 corresponds to one address (row address+column address) constituting the sequence. Referring to FIG. 4, RAS indicates a test row address strobe signal supplied from the tester to the memory unit main body 10; CAS indicates a test column address strobe signal supplied from the tester to the memory unit main body 10; W indicates a test write enable signal supplied from the tester to the memory unit main body 10; A(11:0) indicates a test address signal supplied from the tester to the memory unit main body 10; CLK indicates a test data write clock signal supplied from the tester to the D flip-flop 9; D-F/F_D(0:7) indicates a m-bit data signal supplied from the tester to the D flip-flop 9; D-F/F_Q(0:7) indicates a m-bit data signal output from the D flip-flop 9; DRAM_D(255:0) indicates a signal on the internal data bus 8 in the test mode; and WDS indicates an input and output data selection signal supplied from the tester to the memory unit main body 10.

A line above a signal name indicates that the associated signal is low-active. Hatching with oblique lines in the timing chart indicates that the associated signal is invalid. Dotted hatching indicates that the associated signal is valid. "0", "1", ... "2q−1" are binary values indicated by the input and output data selection signal. FIG. 4 shows a case where m=8 and (m*n)=256.

The tester supplies the m-bit data signal to the D flip-flop 9. In this state, the test data write clock signal is input at T1. The data signal is latched by the D flip-flop 9 so that the latched signal is made to branch to the n individual bus signal lines. Consequently, the (m×n)-bit data is output to the internal data bus 8. In a state in which the tester sets the test address signal for a row address, the test row address strobe signal is asserted at time T2. The address is then decoded by the memory unit main body 10 so that the memory elements on the bit line pairs 30 corresponding to the address are selected.

When the write data and the row address have been set, data is sequentially written to the memory elements at time T3, T4 ... Tn. More specifically, the tester sets a test address signal for a common column address at time T3, T4 ... Tn and asserts the test write enable signal by bringing it to a low level. Further, the tester asserts the test column address strobe signal by bringing it to a low level in a state in which the input and output data selection signal is set. With this, data on the internal data bus 8a is written to each of the memory blocks constituting the memory circuits selected by the input and output data selection signal. The operation is repeated 2q times by incrementing the level of the input and output selection signal from "00 ... 00" to "11 ... 11". The same data is written to the (x+1) memory elements constituting each memory block.

By repeating the write operation for the entirety of addresses in the memory unit 2, that is, repeated a number of times which is equal to the number of column addresses multiplied by the number of row addresses, predetermined data is written to all of the total of ($2^q \times (x+1) = m \times n$) memory elements in the test mode.

Figure 5:
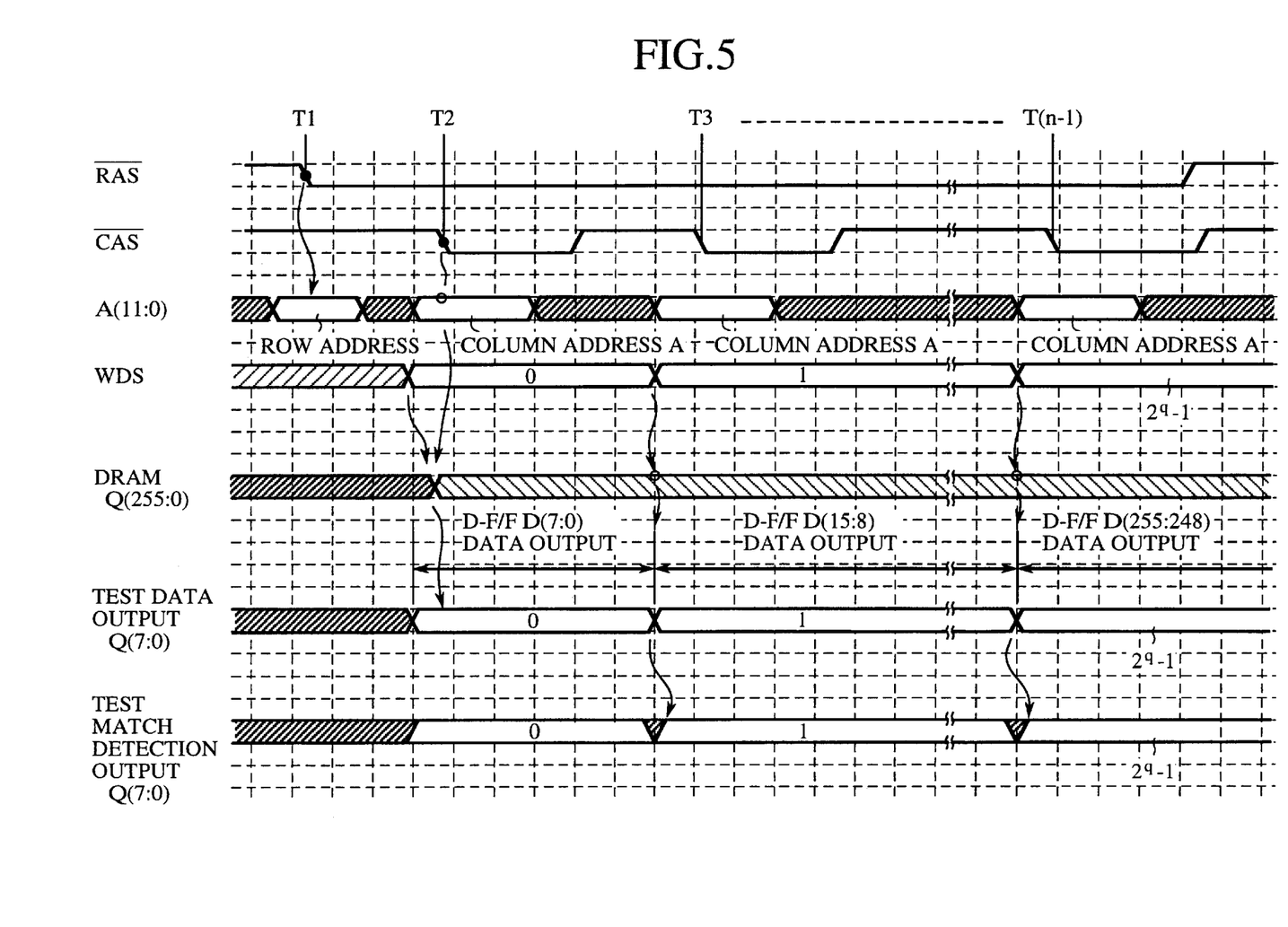
FIG. 5 is a timing chart showing a read process according to the first embodiment for reading from the memory unit main body in the test mode.

In the subsequent step in the test mode, a sequence is executed whereby the tester reads out the data from all of the memory elements and evaluate the readout data. FIG. 5 is a timing chart showing a read process according to the first embodiment for reading from the memory unit main body 10 in the test mode. Referring to FIG. 5, the test data output_Q(7:0) is a m-bit read data signal output from the data multiplexer 16. The test match detection output_Q(7:0) is a m-bit match determination data signal output from the match determination multiplexer 18. Referring to the portion of the chart showing these signals, "0", "1", ... "2q−1" indicate binary values indicated by the corresponding input and output selection signals.

The tester sets the test address signal for the row address. By asserting the test row address strobe signal at time T1, the address is decoded by the memory unit main body 10 so that the memory elements on the bit line pairs 30 corresponding to the address are selected.

When the setting has been provided, data is sequentially read out from the memory cells at time T2, T3 ... T(n−1). More specifically, the tester sets a test address signal for a common column address at time T2, T3 ... T(n−1). With this, the data from the memory elements is set in the internal data bus 8a. Subsequently, the tester asserts the test column address strobe signal by bringing it to a low level in a state in which the input and output data selection signal is set. With this, the (x+1)-bit readout data selected by the input and output data selection signal is output from the data multiplexer 16. A match determination based on the (x+1)-bit data is output from the match determination multiplexer 18. This operation is repeated $2^q$ times by sequentially changing the value of the input and output data selection signal. Consequently, the $2^q$ readout data and the $2^q$ match determination data relating to a total of (x+1) memory elements are output.

The write operation is repeated for the entirety of addresses of the memory unit 2 totaling the number of column addresses multiplied by the number of row addresses, so that the tester obtains the readout data and the match determination data based on the entirety of the ($2^q \times (x+1) = m \times n$) memory elements.

As a result, if an evaluation obtained based on the written data differs from that based on the readout data, a recovery code for replacing the defective memory block 31 that caused the error by the recovery memory block 32 is generated. The operator detaches the defective memory block 31 from the rest or the memory unit 2, based on the recover code, and a fuse is blown so that the recovery memory block 32 is used in place of the defective memory block 31. In the absence of the defective memory block 31, the fuse is blown so that the recovery memory block 32 is detached from the rest of the memory unit 2.

As has been described, according to the first embodiment, the memory unit main body 10 causes the m-bit write data from the D flip-flop 9 to branch to individual signal lines each carrying (x+1) bits, where m<(x+1). The test data is written to the memory circuits in a total of $2^q$ operations in accordance with the binary value indicated by the q-bit input and output data selection signal, where n>$2^q$. The test data is read out in units of (x+1) bits in a total of $2^q$ operations. Thus, the test data is written to and read from all of the memory elements at the entirety of addresses in a total of $2^q$ processes, where $2^q$ is smaller than the related-art frequency of n.

Similarly, according to the first embodiment, the data multiplexer 16 selects 1 bit from each of the memory circuits and converts the bits into the m-bit readout data. The match determination multiplexer 18 selects the outputs of the match detection circuits 17 and converts the selected outputs to the m-bit match determination data. Accordingly, a determination can be made as to whether a recovery is necessary in the memory circuits, for each binary value indicated by the input and output data selection signal. A determination on recovery can be made on all of the addresses after a total of $2^q$ read processes.

Since a determination on the memory circuits can be made using only the readout data and the match determination data, the tester can make a determination at a speed advantageous over the speed of the related art.

Embodiment 2

The integrated circuit according to the related art is similar in construction to the circuit of the first embodiment except that the memory unit main body 10 divides the data input m-bit parallel from the D flip flop 9 into units of integral multiples of (x+1) bits. The resultant bits are written to the memory circuits in a total of $2^q$ operations. Likewise, the data is read out from the memory circuits in units of integral multiples of (x+1) bits in a total of $2^q$ operations. Similarly to the first embodiment, the total number of memory elements constituting the memory circuits in the memory unit main body 10 is (m×n).

Each of the memory circuits constituting the memory unit main body 10 receives (x+1)-bit data. By ensuring that the data from the D flip flop 9 is written to the memory unit main body 10 in units of integral multiples of (x+1) bits in a total of $2^q$ operations, the number of memory circuits in which the data is written simultaneously in an operation is increased accordingly.

Likewise, by reading the data from the memory circuits of the memory unit main body 10 in units of integral multiples of (x+1) bits in a total of $2^q$ operations, the number of memory circuits from which the data is read out simultaneously is increased accordingly.

The internal data buses 8a and 8b have the width of $2^q \times (x+1)r = m \times n$, where q, x, r, m and n indicate positive integers and $r \geq 22$.

As has been described, according to the second embodiment, the time required in a test mode for a test data write and a test data read in the memory circuits constituting the memory unit main body 10 is reduced in comparison with the corresponding time required in the first embodiment.

Embodiment 3

Figure 6:
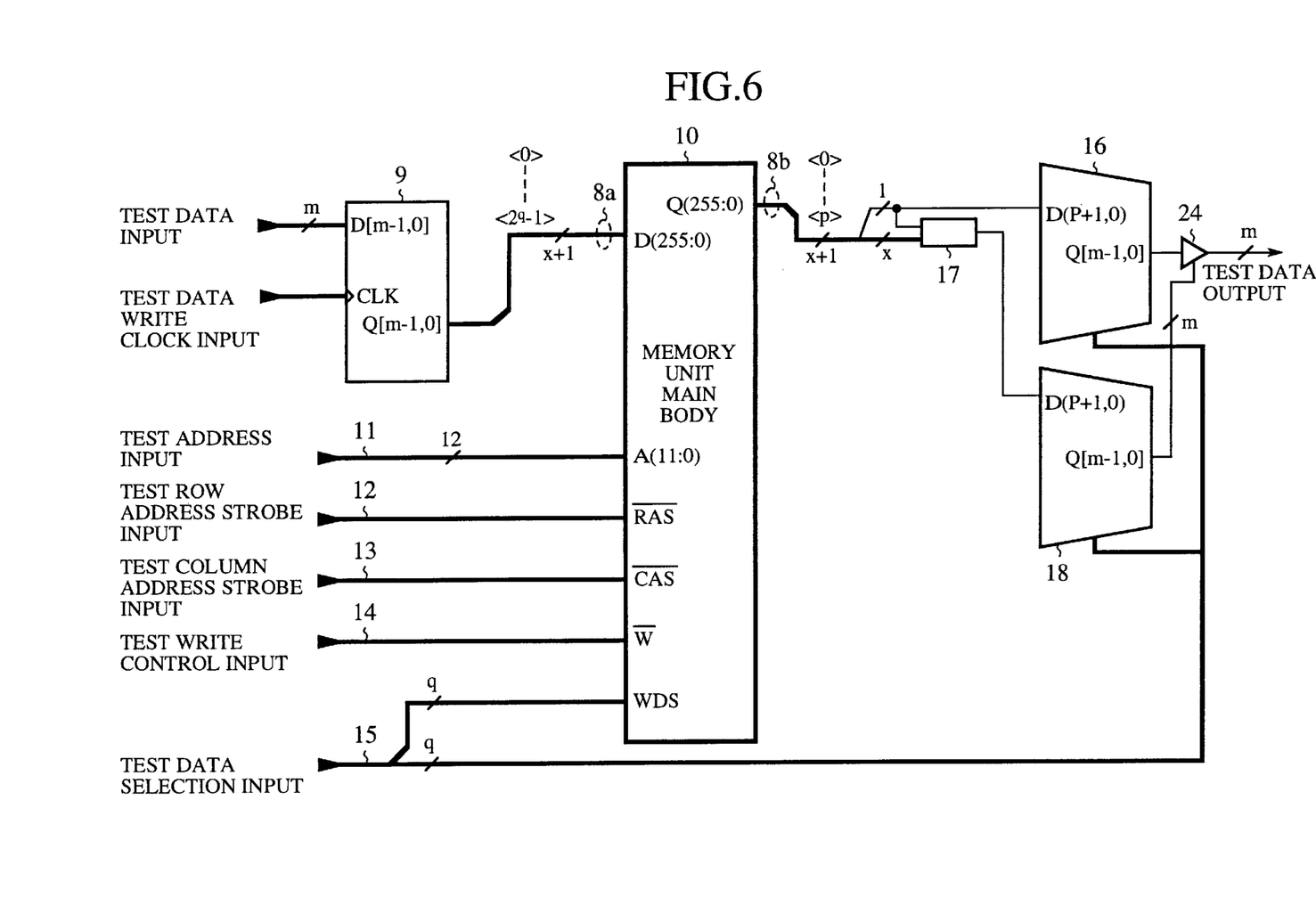
FIG. 6 is a block diagram showing a construction of the memory unit according to a third embodiment of the present invention.

FIG. 6 is a block diagram showing a construction of the memory unit 2 according to a third embodiment of the present invention. Referring to FIG. 6, the memory unit 2 comprises a tristate buffer 24 for m-bit input and output receiving the readout data from the data multiplexer 16 and also receiving, as a control signal, the match determination data from the match determination multiplexer 18. The tristate buffer 24 brings its output to a high-impedance state when at least one of the (p+1) determination results relating to the memory circuits indicates a mismatch. In the other cases, the tristate buffer 24 transparently outputs the input thereto. The other aspects of the construction and operation are the same as the corresponding aspects of the first embodiment and the description thereof is omitted.

As a result, if an evaluation obtained based on the written data differs from that based on the readout data (including a case of high impedance), a recovery code for replacing the defective memory block 31 that caused the error by the recovery memory block 32 is generated. The operator detaches the defective memory block 31 from the rest of the memory unit 2, based on the recovery code, and a fuse is blown so that the recovery memory block 32 is used in place of the defective memory block 31. In the absence of the defective memory block 31, the fuse is blown so that the recovery memory block 32 is detached from the rest of the memory unit 2.

When it is determined that the output from the tristate buffer 24 is not in a high-impedance state, determination on the integrity of the memory circuits based on the readout data can proceed simultaneously. Thus, determination by the tester can proceed at a speed advantageous over that of the related art.

Since there is no need to connect the output from the match detection multiplexer 18 to the tester, an efficient memory test can be conducted without increasing the number of signal lines connecting the tester and the integrated circuit.

Embodiment 4

Figure 7:
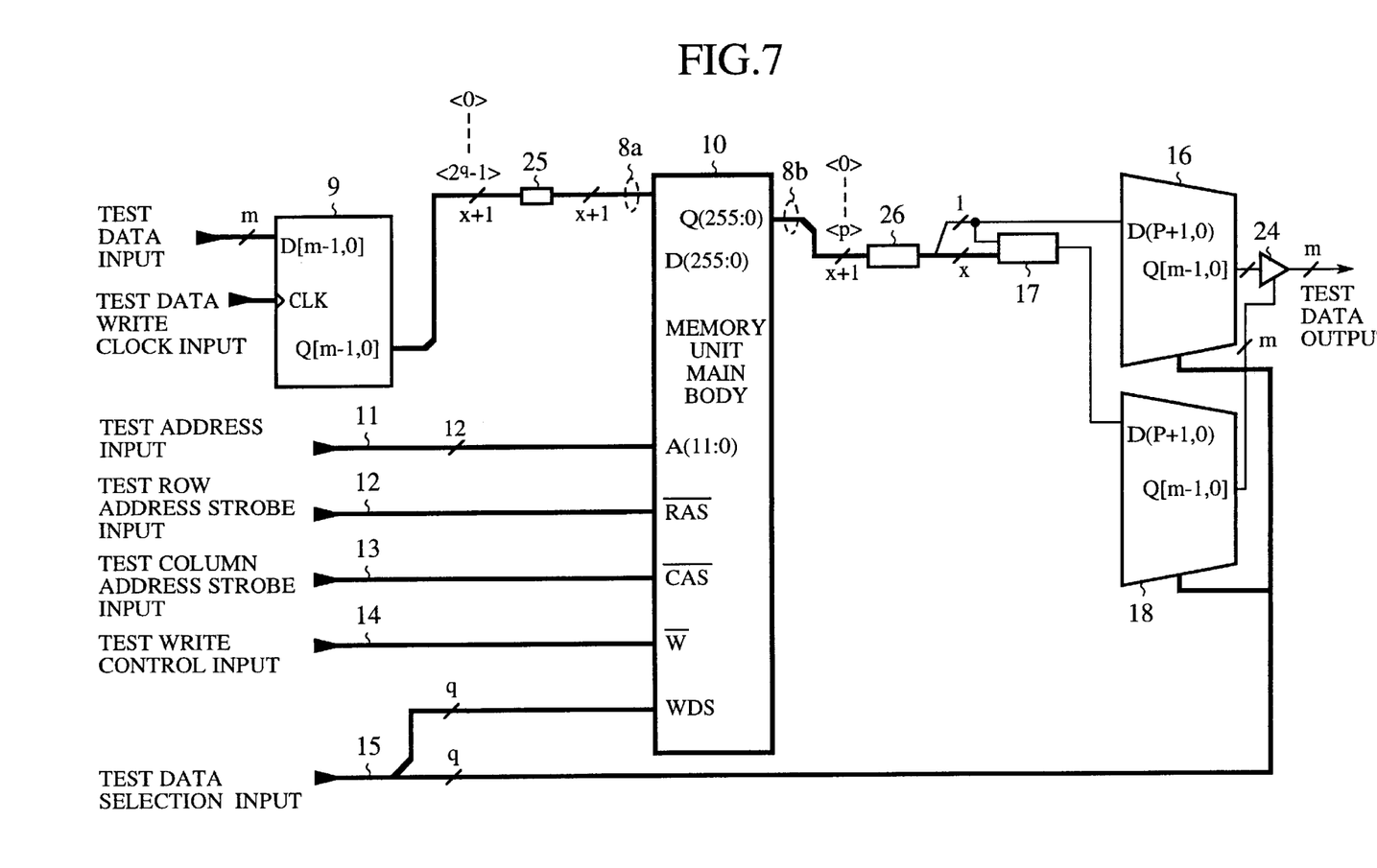
FIG. 7 is a block diagram showing a construction of the memory unit according to a fourth embodiment of the present invention.

FIG. 7 is a block diagram showing a construction of the memory unit 2 according to the fourth embodiment of the present invention. Referring to FIG. 7, the memory unit 2 comprises encoders 25 provided for respective memory circuits between the D flip-flop 9 and the internal data bus 8a and encoding the (x+1)-bit data input to the respective memory circuits. The memory unit 2 also comprises decoders 26 provided for respective memory circuits between the internal bus 8b and the match detection circuit 17 and decoding the (x+1)-bit data output from the respective memory circuits in a process opposite to the encoding process by the encoder 25.

Figure 8A:
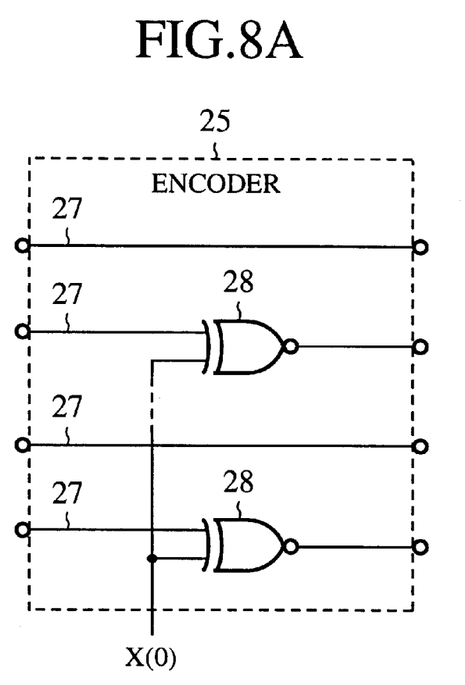
FIG. 8A is a block diagram showing a construction of an encoder provided for each memory circuit according to the fourth embodiment.
Figure 8B:
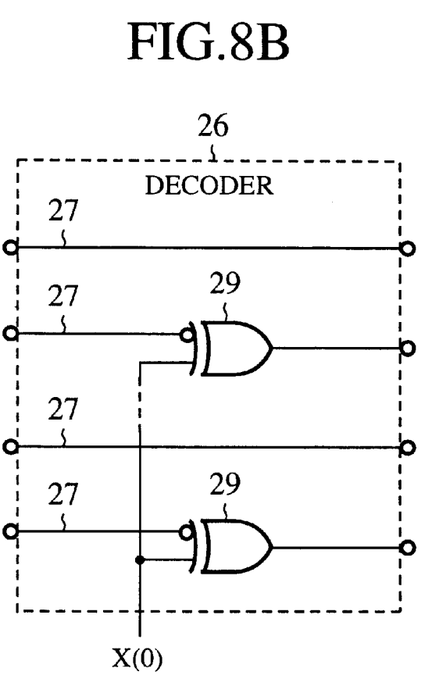
FIG. 8B is a block diagram showing a construction of a decoder provided for each memory circuit according to the fourth embodiment.

FIG. 8A is a block diagram showing a construction of the encoder 25 provided for each memory circuit according to the fourth embodiment; and FIG. 8B is a block diagram showing a construction of the decoder 26 provided for each memory circuit according to the fourth embodiment. Referring to FIGS. 8A and 8B, the encoder 25 comprises (x+1) data signal lines 27; and two-input XOR circuits 28 provided for alternate bit line pairs 30 in the integrated circuit, one of the inputs of each of the XOR circuits 28 being a signal on a respective one of the data signal lines 27. The decoder 26 comprises the (x+1) data signal lines 27; and two-input XOR circuits 29 each corresponding to a respective one of the XOR circuits 28, one of the inversion inputs of each of the XOR circuits 29 being a signal on a respective one of the data signal lines 27. Assuming that (x+1) is an even number, a total of (x+1)/2 XOR circuits 28 and 29 are provided. The other input of each of the XOR circuits 28 and 29 is a 1-bit column address The other aspects of the construction are the same as the corresponding aspects in the second embodiment.

A description will now be given of the operation according to the third embodiment.

When the XOR circuit 28 receives 1-bit column address at "0" (low level) and an input of "1" (high level), the XOR circuit 28 outputs "0" (low level) to the internal bus 8. When XOR circuit 28 receives 1-bit column address at "0" (low level) and an input of "0" (low level), the XOR circuit 28 outputs "1" (high level) to the internal data bus 8. The XOR circuit 29 inverses a "0" (low level) input thereto so as to output "1" (high level) to the match detection circuit 17 and also inverses a "1" (high level) input thereto so as to output "0" (low level) to the match detection circuit 17. When the memory unit main body 10 stores data properly, the same data as output from the D flip-flop 9 is output to the match detection circuit 17.

When the XOR circuit 28 receives 1-bit column address at "1" (high level) and an input of "1" (high level), the XOR circuit 28 outputs "1" (high level) to the internal bus 8. When XOR circuit 28 receives 1-bit column address at "1" (high level) and an input of "0" (low level), the XOR circuit 28 outputs "0" (low level) to the internal data bus 8. The XOR circuit 29 transparently output a "0" (low level) input thereto to the match detection circuit 17 and also transparently output a "1" (high level) input thereto to the match detection circuit 17. When the memory unit 10 stores data properly, the same data as output from the D flip-flop 9 is output to the match detection circuit 17. The aspects of the operation are the same as the corresponding aspects in the second embodiment and the description thereof is omitted.

By writing data different from the write data to alternate bit line pairs 30 in the integrated circuit, in accordance with the 1-bit column address, and by reading out the data for determination on integrity of memory, it is possible to detect short-circuit that occurs between two bit line pairs 30 adjacent to each other in the memory circuit layout.

A detailed description will be given below. In the first and second embodiments, data "00 . . . 00" ("11 . . . 11") is written to all of the memory circuits. With this configuration, even if short-circuit occurs between the adjacent bit line pairs 30, the match detection circuit 17 receives the data "00 . . . 00" ("11 . . . 11"), thus producing a determination that the data match. In contrast, according to the third embodiment, "00 . . . 00" ("11 . . . 11") or "01 . . . 01" ("10 . . . 10") is written depending on the address. For example, when short-circuit occurs between a first bit line pair 30 for the lower-most significant bit and a second bit line pair 30 for the second bit adjacent to the first bit line pair 30, the readout data for the data "01 . . . 01" ("10 . . . 10") is "01 . . . 00" ("10 . . . 00") or "01 . . . 11" ("10 . . . 11"). Therefore, the match detection circuit 17 can make a proper determination that the data do not match.

With this, short-circuit between the adjacent two bit line pairs can be detected properly, even when the same data is provided in a degenerative manner to the encoder connected to the (x+1) bit line pairs 30.

It will be appreciated that the present invention provides various advantages as described in the following.

According to a first aspect of the present invention, test data can be written in all of the memory circuits using write operations fewer than that of the related art. Accordingly, the same number of input and output terminals for write data as used in the related art can be utilized for more efficient data write operation.

According to a second aspect of the invention, test data can be read out from the entirety of the memory circuits with fewer reading operations. The same number of input and output terminals for readout data as used in the related art can be utilized for more efficient data read operation.

According to a third aspect of the present invention, determination on integrity of the memory circuits can be conducted using the readout data and the match determination data simultaneously. Therefore, the tester can yield a determination at a speed advantageous over that of the related art.

According to a fourth aspect of the invention, a determination is made as to whether the output from the tristate buffer is in a high-impedance state. If the output is not in a high-impedance state, determination on the integrity of the memory circuits can proceed simultaneously, based on the readout data. Accordingly, determination can be yielded at a speed advantageous over that of the related art.

According to a fifth aspect of the invention, since there is no need to provide the output from the match detection circuit to the tester, a desired memory test can be conducted without increasing the number of signal lines connecting the tester and the integrated circuit.

According to a sixth aspect of the invention, the (x+1) bit line pairs may receive different data depending on the address, by appropriately processing the original test data.

By operating the encoder and the decoder in accordance with the address, short-circuit occurring between the two adjacent bit line pairs can be properly detected in a degenerative arrangement where the same data is written to the bit line pairs.

The present invention is not limited to the above-described embodiments, and variations and modifications may be made without departing from the scope of the present invention.

What is claimed is:

1. An integrated circuit comprising:

a D flip-flop receiving m-bit write data and a clock signal, causing the m-bit data latched by the clock signal to branch to n individual signal lines and outputting the resultant (m×n)-bit data; and a plurality of memory circuits provided with a plurality of memory blocks including a recovery memory block and configured to input and output (x+1)-bit data simultaneously; and a write control circuit receiving, m-bit parallel, the (m×n)-bit data output from the D flip-flop, receiving a q-bit data selection signal and writing, in accordance with a binary value indicated by the q-bit data selection signal, the output data from the D flip flop to the plurality of memory circuits in units of integral multiplex of (x+1) bits in a total of $2^q$ operations, where m, n, x, and q indicate positive integers, (x+1)>m and n>$2^q$.

2. The integrated circuit according to claim 1, further comprising:

a match determination circuit subjecting the multiples-of-(x+1)-bit data output from each of the plurality of memory circuits to determination on a match and outputting results of the determination;

a determination result output circuit receiving results of the determination from said match determination circuit, receiving the q-bit data selection signal and outputting match determination data indicating a data mismatch found in said match determination circuit in accordance the binary value indicated by the data selection signal.

3. The integrated circuit according to claim 2, further comprising:

a tristate buffer receiving the readout data from the plurality of memory circuits and receiving, as a control signal, the output from said determination result output circuit.

4. The integrated circuit according to claim 1, further comprising:

encoders each provided for a corresponding memory circuit in which the same data is written, so as to encode data input to the corresponding memory circuit; and decoders each provided for a corresponding memory circuit in which the same data is written, so as to encode data output the corresponding memory circuit.

5. The integrated circuit according to claim 4, wherein said encoders and decoders are operated in accordance with an address.

* * * * *